United States Patent
Nguyen et al.

(10) Patent No.: US 11,072,860 B2
(45) Date of Patent: Jul. 27, 2021

(54) FILL ON DEMAND AMPOULE REFILL

(71) Applicant: Lam Research Corporation, Fremont, CA (US)

(72) Inventors: Tuan Nguyen, Beaverton, OR (US); Eashwar Ranganathan, Tigard, OR (US); Shankar Swaminathan, Beaverton, OR (US); Adrien LaVoie, Newberg, OR (US); Chloe Baldasseroni, Portland, OR (US); Ramesh Chandrasekharan, Portland, OR (US); Frank L. Pasquale, Beaverton, OR (US); Jennifer L. Petraglia, Portland, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 1226 days.

(21) Appl. No.: 14/720,595

(22) Filed: May 22, 2015

(65) Prior Publication Data

US 2016/0052655 A1 Feb. 25, 2016

Related U.S. Application Data

(63) Continuation-in-part of application No. 14/516,452, filed on Oct. 16, 2014, now abandoned.
(Continued)

(51) Int. Cl.
*C23C 16/52* (2006.01)
*C23C 16/448* (2006.01)

(52) U.S. Cl.
CPC ............ *C23C 16/52* (2013.01); *C23C 16/448* (2013.01)

(58) Field of Classification Search
None
See application file for complete search history.

(56) References Cited

U.S. PATENT DOCUMENTS 3,669,312 A * 6/1972 Kuckens .................. B65B 1/42
222/641
5,465,766 A 11/1995 Siegele et al.
(Continued)

FOREIGN PATENT DOCUMENTS

| CN | 1501053 A | 6/2004 |
| CN | 100438960 C | 12/2008 |

(Continued)

OTHER PUBLICATIONS

U.S. Office Action, dated Jun. 30, 2017, issued in U.S. Appl. No. 14/516,452.
(Continued)

*Primary Examiner* — Joel G Horning
(74) *Attorney, Agent, or Firm* — Weaver Austin Villeneuve & Sampson LLP

(57) ABSTRACT

Methods and apparatus for use of a fill on demand ampoule are disclosed. The fill on demand ampoule may refill an ampoule with precursor concurrent with the performance of other deposition processes. The fill on demand may keep the level of precursor within the ampoule at a relatively constant level. The level may be calculated to result in an optimum head volume. The fill on demand may also keep the precursor at a temperature near that of an optimum precursor temperature. The fill on demand may occur during parts of the deposition process where the agitation of the precursor due to the filling of the ampoule with the precursor minimally effects the substrate deposition. Substrate throughput may be increased through the use of fill on demand.

14 Claims, 12 Drawing Sheets

Related U.S. Application Data

(60) Provisional application No. 62/040,974, filed on Aug. 22, 2014.

(56) References Cited

U.S. PATENT DOCUMENTS

| | | | |
|---|---|---|---|
| 6,007,675 | A | 12/1999 | Toshima |
| 6,015,066 | A | 1/2000 | Kimura et al. |
| 6,217,657 | B1 | 4/2001 | Kiba et al. |
| 6,277,201 | B1 | 8/2001 | Nishikawa |
| 7,775,508 | B2 | 8/2010 | Choi et al. |
| 10,094,018 | B2 | 10/2018 | Kumar et al. |
| 2005/0095859 | A1 | 5/2005 | Chen et al. |
| 2005/0173016 | A1* | 8/2005 | Ludwig ............... B65B 1/42 141/2 |
| 2006/0121192 | A1 | 6/2006 | Jurcik et al. |
| 2006/0222768 | A1 | 10/2006 | Faguet |
| 2008/0044573 | A1 | 2/2008 | Chen et al. |
| 2008/0149031 | A1 | 6/2008 | Chu et al. |
| 2008/0168946 | A1 | 7/2008 | Chu et al. |
| 2009/0183549 | A1 | 7/2009 | Monkowski et al. |
| 2009/0205563 | A1 | 8/2009 | Arena et al. |
| 2009/0211525 | A1 | 8/2009 | Sarigiannis et al. |
| 2009/0223451 | A1 | 9/2009 | Kruger et al. |
| 2009/0255466 | A1 | 10/2009 | Peck |
| 2010/0305884 | A1 | 12/2010 | Yudovsky et al. |
| 2011/0256726 | A1 | 10/2011 | LaVoie et al. |
| 2012/0216712 | A1* | 8/2012 | Paranjpe ............ C23C 16/06 106/287.18 |
| 2013/0019960 | A1 | 1/2013 | Choi et al. |
| 2013/0171834 | A1 | 7/2013 | Haverkamp et al. |
| 2013/0196078 | A1 | 8/2013 | Yudovsky et al. |
| 2013/0210241 | A1 | 8/2013 | LaVoie et al. |
| 2014/0209562 | A1 | 7/2014 | LaVoie et al. |
| 2014/0248772 | A1 | 9/2014 | Ma et al. |
| 2015/0275367 | A1 | 10/2015 | Moroi et al. |
| 2015/0299858 | A1* | 10/2015 | Yudovsky ........... C23C 16/4481 427/255.28 |
| 2016/0052651 | A1 | 2/2016 | Nguyen et al. |
| 2016/0079057 | A1 | 3/2016 | Varadarajan et al. |
| 2016/0351401 | A1 | 12/2016 | Ba et al. |
| 2017/0096735 | A1 | 4/2017 | Kumar et al. |
| 2017/0362705 | A9 | 12/2017 | Kumar et al. |
| 2019/0024233 | A1 | 1/2019 | Kumar et al. |

FOREIGN PATENT DOCUMENTS

| | | |
|---|---|---|
| CN | 101415977 A | 4/2009 |
| CN | 101514446 A | 8/2009 |
| CN | 102272351 A | 12/2011 |
| CN | 102348829 A | 2/2012 |
| CN | 1934287 B | 6/2012 |
| CN | 103041954 A | 4/2013 |
| CN | 103688339 A | 3/2014 |
| JP | S63-136614 A | 6/1988 |
| JP | H06-005985 | 1/1994 |
| JP | H07-150359 A | 6/1995 |
| JP | 2004-031782 A | 1/2004 |
| JP | 2005-056918 A | 3/2005 |
| JP | 2006-052424 A | 2/2006 |
| JP | 2006-114803 A | 4/2006 |
| JP | 2008-172246 A | 7/2008 |
| JP | 2009-016799 A | 1/2009 |
| JP | 2009-215635 A | 9/2009 |
| JP | 2009-532579 A | 9/2009 |
| JP | 2012-515842 A | 7/2012 |
| JP | 2015-512144 A | 4/2015 |
| TW | 200716778 A | 5/2007 |
| TW | 201144475 A1 | 12/2011 |
| WO | WO 2004/010463 | 1/2004 |
| WO | WO 2007/115000 A2 | 10/2007 |
| WO | WO 2009/004117 | 1/2009 |
| WO | WO 2010083510 A1 | 7/2010 |

OTHER PUBLICATIONS

U.S. Final Office Action, dated Jan. 5, 2018, issued in U.S. Appl. No. 14/516,452.
U.S. Office Action, dated Feb. 17, 2017, issued in U.S. Appl. No. 14/929,073.
U.S. Office Action, dated Sep. 29, 2017, issued in U.S. Appl. No. 14/929,073.
Chinese First Office Action dated Oct. 19, 2017 issued in Application No. CN 201510523984.6.
U.S. Office Action, dated Jun. 14, 2018, issued in U.S. Appl. No. 14/516,452.
U.S. Notice of Allowance, dated Jun. 8, 2018, issued in U.S. Appl. No. 14/929,073.
U.S. Office Action, dated Nov. 16, 2018, issued in U.S. Appl. No. 16/137,329.
Taiwanese First Office Action dated Apr. 2, 2019 issued in Application No. TW 104127252.
Japanese First Office Action dated Jun. 24, 2019 issued in Application No. JP 2015-162483.
Japanese Second Office Action dated May 12, 2020 issued in Application No. JP 2015-162483.
Chinese First Office Action dated May 28, 2018 issued in Application No. CN 201610345105.X.
Chinese Second Office Action dated Jan. 28, 2019 issued in Application No. CN 201610345105.X.
Chinese Third Office Action dated Aug. 2, 2019 issued in Application No. CN 201610345105.X.
Japanese First Office Action dated May 26, 2020 issued in Application No. JP 2016-096649.
Taiwanese First Office Action dated Nov. 28, 2019 issued in Application No. TW 105115410.
Chinese First Office Action dated Sep. 27, 2019 issued in Application No. CN 201610865153.1.
Taiwanese First Office Action dated Sep. 2, 2020 issued in Application No. TW 105131453.
Japanese Decision of Grant dated Nov. 4, 2020 issued in Application No. JP 2016-192428.
U.S. Final Office Action, dated Feb. 2, 2021, issued in U.S. Appl. No. No. 16/137,329.

* cited by examiner

FILL ON DEMAND AMPOULE REFILL

CROSS-REFERENCE TO RELATED APPLICATIONS

This application is a continuation-in-part of U.S. patent application Ser. No. 14/516,452, filed Oct. 16, 2014, which in turn claims priority benefit under 35 U.S.C. § 119(e) to U.S. Provisional Application No. 62/040,974, filed Aug. 22, 2014, titled "FILL ON DEMAND AMPOULE," each of which is hereby incorporated by reference in its entirety.

BACKGROUND

Certain substrate processing operations may utilize a precursor. The precursor may be contained in an ampoule and periodically delivered to a reactor. Consistent head volume and consistent precursor temperature may be desired to ensure the uniformity of substrates processed. Additionally, agitation of the precursor from refilling may be undesirable when substrates are processed. Refill takes time and may affect reduce throughput.

SUMMARY

In certain implementations, a method for refilling an ampoule of a substrate processing apparatus may be detailed. The method may include: (a) determining that an ampoule refill start condition is met, wherein the ampoule refill start condition comprises determining that the substrate processing apparatus is or is about to enter a phase during which agitation of the precursor caused by refilling the ampoule with the precursor would have a minimal effect on the consistency of substrates processed by the substrate processing apparatus, (b) refilling the ampoule with precursor, wherein refilling the ampoule with the precursor is performed concurrent with at least one other substrate processing operation, (c) determining that an ampoule refill stop condition is met, and (d) ceasing the refilling of the ampoule with the precursor.

One aspect of the disclosure pertains to methods for filling an ampoule of a substrate processing apparatus. Such methods may be characterized by the following operations: (a) determining that an ampoule fill start condition for filling the ampoule with a liquid precursor is met; (b) filling the ampoule with precursor, wherein filling the ampoule with the precursor is performed concurrent with at least one other substrate processing operation; (c) reading a sensor level in the ampoule indicating that the filling is not yet complete; (d) determining that a secondary fill stop condition is met; and (e) in response to determining that the secondary fill stop condition is met, ceasing the filling of the ampoule with the precursor.

In certain embodiments, the methods further include maintaining a cumulative time of filling starting at the end of the last time when the ampoule received the precursor. In some implementations, the secondary fill stop condition involves determining that the cumulative time of filling exceeds a threshold. In some implementations, the cumulative time of filling is temporarily stopped one or more times when ampoule refill temporarily ceases and deposition commences, but the cumulative time of filling restarts when filling starts again. In some implementations, the threshold is between about 50 seconds and 90 seconds.

In certain embodiments, the methods include initiating a soft shutdown when ceasing the filling in operation (e). In some cases, the method is executed when the sensor generating the sensor level in the ampoule is malfunctioning. In some cases, the method is executed when a system providing the liquid precursor to the ampoule is malfunctioning.

In certain embodiments, the ampoule fill start condition involves determining that the substrate processing apparatus is in or is about to enter a phase during which agitation of the liquid precursor caused by filling the ampoule with the precursor would have a minimal effect on the consistency of substrates processed by the substrate processing apparatus. In some embodiments, the ampoule fill start condition involves determining that a sequence of deposition operations has been completed on substrates contained in the substrate processing apparatus. In some cases, the sequence of deposition operations are deposition operations associated with Atomic Layer Deposition. In certain embodiments, the ampoule fill start condition includes determining that the precursor volume is below a threshold volume. In certain embodiments, the ampoule fill start condition includes determining that setup for deposition operations is currently being performed.

In some implementations, the at least one other substrate processing operation that is performed concurrent with filling the ampoule includes a wafer indexing operation. In some cases, the at least one other substrate processing operation that is performed concurrent with filling the ampoule includes a temperature soak of the precursor and/or the substrate. In some cases, the at least one other substrate processing operation that is performed concurrent with filling the ampoule includes a pump to base operation.

Some aspects of the disclosure pertain to methods for controlling the filling an ampoule of a substrate processing apparatus. Such methods may be characterized by the following operations: (a) starting a counter of the number of deposition cycles during which a precursor is delivered to a reaction chamber of the substrate processing apparatus, wherein the precursor is stored in liquid form in the ampoule; (b) determining that an ampoule fill start condition is met; (c) reading a sensor level in the ampoule indicating that the ampoule is sufficiently full that the liquid precursor should not be provided to the ampoule; (d) determining that a number of deposition cycles counted by the counter exceeds a threshold; and (e) in response to determining that the number of deposition cycles counted by the counter exceeds a threshold, ceasing the deposition cycles. In some implementations, the threshold is between about 3000 and 6000 deposition cycles.

In certain embodiments, starting the counter in (a) occurs when the liquid precursor is delivered to the ampoule, and the counter continues to count until liquid precursor is again delivered to the ampoule. In some implementations, he method includes initiating a soft shutdown when ceasing the deposition cycles in operation (e).

In some cases, the method is executed when the sensor generating the sensor level in the ampoule is malfunctioning. In certain embodiments, the ampoule fill start condition includes determining that the substrate processing apparatus is in or is about to enter a phase during which agitation of the liquid precursor caused by filling the ampoule with the precursor would have a minimal effect on the consistency of substrates processed by the substrate processing apparatus. In certain embodiments, the ampoule fill start condition includes determining that a sequence of deposition operations has been completed on substrates contained in the substrate processing apparatus. In some examples, the sequence of deposition operations are deposition operations associated with Atomic Layer Deposition.

In some implementations, the ampoule fill start condition includes determining that setup for deposition operations is currently being performed. In some implementations, the ampoule fill condition includes one other substrate processing operation that is performed concurrent with filling the ampoule selected from the group consisting of a wafer indexing operation, a temperature soak of the precursor and/or the substrate, a pump to base operation.

Some aspects of the disclosure pertain to precursor refill systems, which may be characterized by the following features: (1) an ampoule configured to be fluidically connected to a precursor delivery system and a precursor source and configured to contain liquid precursor; and (2) one or more controllers configured to: (a) start a counter of the number of deposition cycles during which a precursor is delivered to a reaction chamber of the substrate processing apparatus, wherein the precursor is stored in liquid form in the ampoule; (b) determine that an ampoule fill start condition is met; (c) read a sensor level in the ampoule indicating that the ampoule is sufficiently full that the liquid precursor should not be provided to the ampoule; (d) determine that a number of deposition cycles counted by the counter exceeds a threshold; and (e) in response to determining that the number of deposition cycles counted by the counter exceeds a threshold, cease the deposition cycles. In some implementations, the threshold comprises between about 3000 and 6000 deposition cycles.

In some designs, the one or more controllers are further configured to start the counter in (a) when the liquid precursor is delivered to the ampoule, and continue to count until liquid precursor is again delivered to the ampoule. In some implementations, the one or more controllers are further configured to initiate a soft shutdown when ceasing the deposition cycles in operation (e).

In certain embodiments, the ampoule fill start condition includes determining that the substrate processing apparatus is in or is about to enter a phase during which agitation of the liquid precursor caused by filling the ampoule with the precursor would have a minimal effect on the consistency of substrates processed by the substrate processing apparatus. In certain embodiments, the ampoule fill start condition includes determining that a sequence of deposition operations has been completed on substrates contained in the substrate processing apparatus. In certain embodiments, the ampoule fill condition includes one other substrate processing operation that is performed concurrent with filling the ampoule selected from the group consisting of a wafer indexing operation, a temperature soak of the precursor and/or the substrate, a pump to base operation.

In some implementations, the substrate processing apparatus includes: a deposition chamber; and a substrate processing station contained within the deposition chamber, wherein the substrate processing station includes a substrate holder configured to receive a substrate and the precursor delivery system is configured to deliver precursor during processing of the substrate received by the substrate processing station.

Another aspect of the disclosure pertains to a precursor refill system including: (1) an ampoule configured to be fluidically connected to a precursor delivery system and a precursor source and configured to contain liquid precursor; and (2) one or more controllers configured to: (a) determine that an ampoule fill start condition for filling the ampoule with a liquid precursor is met; (b) fill the ampoule with precursor, wherein filling the ampoule with the precursor is performed concurrent with at least one other substrate processing operation; (c) read a sensor level in the ampoule indicating that the filling is not yet complete; (d) determine that a secondary fill stop condition is met; and (e) in response to determining that the secondary fill stop condition is met, cease the filling of the ampoule with the precursor.

In certain embodiments, the one or more controllers are further configured to maintain a cumulative time of filling starting at the end of the last time when the ampoule received the precursor. In some cases, the secondary fill stop condition includes determining that the cumulative time of filling exceeds a threshold. In some implementations, the one or more controllers are further configured to temporarily stop the cumulative time of filling one or more times when ampoule refill temporarily ceases and deposition commences.

In some implementations, the threshold is between about 50 seconds and 90 seconds. In some implementations, the one or more controllers are further configured to initiate a soft shutdown when ceasing the filling in operation (e).

In certain embodiments, the ampoule fill start condition includes determining that the substrate processing apparatus is in or is about to enter a phase during which agitation of the liquid precursor caused by filling the ampoule with the precursor would have a minimal effect on the consistency of substrates processed by the substrate processing apparatus. In certain embodiments, the ampoule fill start condition includes determining that the precursor volume is below a threshold volume. In some implementations, the at least one other substrate processing operation that is performed concurrent with filling the ampoule includes a temperature soak of the precursor and/or the substrate.

In some embodiments, substrate processing apparatus includes: a deposition chamber; and a substrate processing station contained within the deposition chamber, wherein the substrate processing station includes a substrate holder configured to receive a substrate and the precursor delivery system is configured to deliver precursor during processing of the substrate received by the substrate processing station.

These and other features of the invention will be described in more detail below with reference to the drawings.

DETAILED DESCRIPTION

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

It is to be understood that, as used herein, the term "semiconductor wafer" may refer both to wafers that are made of a semiconductor material, e.g., silicon, and wafers that are made of materials that are not generally identified as semiconductors, e.g., dielectrics and/or conductors, but that typically have semiconductor materials provided on them. Silicon on insulator (SOI) wafers are one such example. The apparatuses and methods described in this disclosure may be used in the processing of semiconductor wafers of multiple sizes, including 200 mm, 300 mm, and 450 mm diameter semiconductor wafers.

Uniformity is an important factor in the processing of high quality semiconductor wafers. For example, the thickness and quality of a deposited layer should be uniform from wafer-to-wafer and within features of a wafer. In certain implementations of semiconductor processing, a liquid precursor may need to be evaporated before being deposited on a semiconductor wafer. The liquid precursor may be contained in an ampoule and a carrier gas, such as argon or other inert gasses, and may flow through the ampoule to carry evaporated precursor to a semiconductor processing chamber. Carrier gas may be either "pushed" (where gas is forced through the lines) or "pulled" (where gas is pulled through the lines, possibly via a vacuum) through the ampoule to carry the evaporated precursor. In certain deposition processes, such as Atomic Layer Deposition (ALD), wafer uniformity may benefit from a relatively constant head volume of gas within the ampoule as well as a constant precursor temperature. In certain such implementations, the targeted head volume may be a volume of about 20-30% of the ampoule volume. Thus, about 70-80% of the ampoule may be filled with precursor when the head volume is about 20-30% of the ampoule volume. Further, wafer uniformity may also benefit from a lack of precursor agitation resulting in uneven evaporation of the precursor. Finally, high wafer throughput is important in the manufacture of semiconductor wafers. Currently, ampoules are typically refilled through manual fill, automatic fill, simultaneous fill, or refilled during maintenance. However, none of the current techniques combine a fairly constant head volume and precursor temperature when used during deposition, lack of precursor agitation during deposition, and high wafer throughput.

Figure 1A:
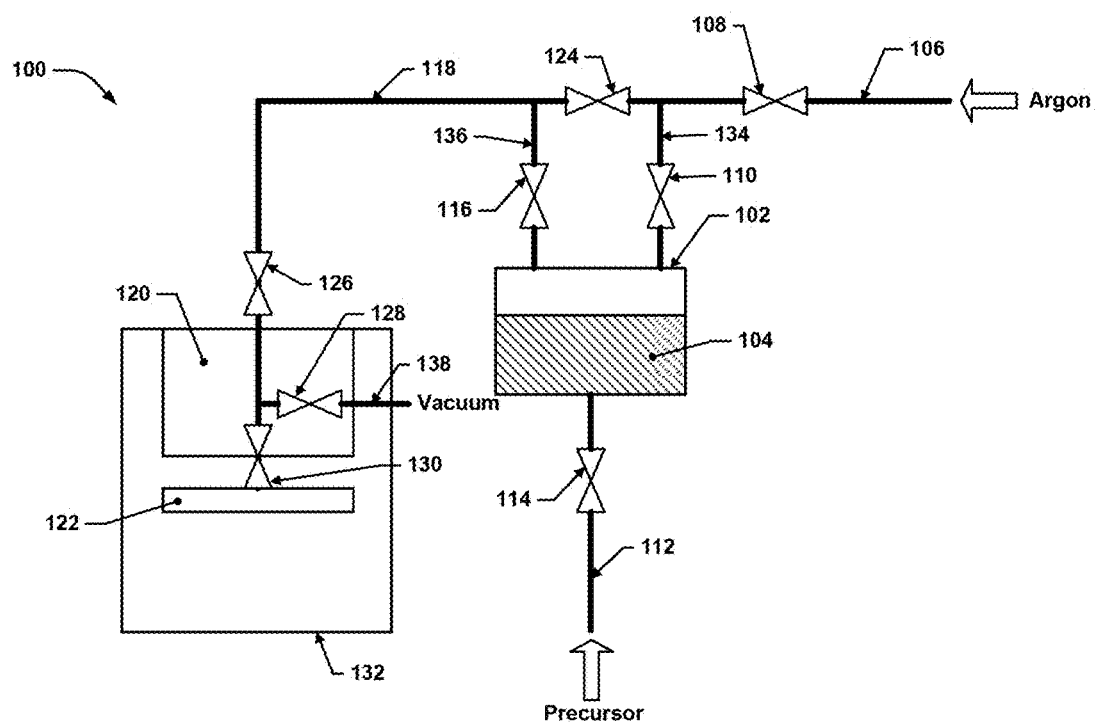
FIG. 1A shows a schematic representation of an example substrate processing apparatus with a fill on demand ampoule.

FIG. 1A shows a schematic representation of an example substrate processing apparatus with a fill on demand ampoule. FIG. 1A shows a substrate processing apparatus 100 with an ampoule 102 and a processing chamber 132.

The ampoule 102 contains precursor 104 in the representation shown in FIG. 1A. In certain implementations, the ampoule may have a volume of between about 600 mL to 3 L. In the implementation shown, the ampoule may be an ampoule of about 1.2 L. The precursor flows into the ampoule 102 through a flow path 112. A valve 114 controls the flow through precursor through the flow path 112. When the valve 114 is open, precursor may flow through the flow path 112 into the ampoule 102, filling the ampoule 102. When the valve 114 is closed, precursor may not flow into the ampoule 102. In the implementation shown, the flow path 112 is a flow path connected to the bottom of the ampoule 102. In other implementations, the flow path containing the precursor may be other configurations such as a dipstick and may fill the ampoule in areas other than from the bottom of the ampoule.

The processing chamber 132 includes a manifold 120 and a showerhead 122. Certain implementations may include more than one showerhead, such as two showerheads or four showerheads. In such implementations, the manifold may distribute fluids to the showerheads. Certain other implementations may replace the manifold with another device for the distribution of precursors, such as an injector. In other implementations, the processing chamber may not contain a manifold.

The showerhead 122 may be fluidically connected to the manifold 120 through a flow path 138 and a valve 130 may be installed on the flow path to control the flow of fluids from the manifold 120 to the showerhead 122. The showerhead 122 may distribute fluids that flow through the flow path 138 to process stations located in the processing chamber 132. The process stations may contain substrates. The process stations are not shown in FIG. 1A.

The manifold 120 may also be connected to a vacuum through other flow paths. The valve 128 may control the vacuum. In certain implementations, at most one of the valves 130 and 128 may be open at any given time. The vacuum may be used to allow for the continuous flow of carrier gas and/or precursor gas when the showerhead 122 is not ready to receive the flow of fluids.

Flow paths 118 and 136 connect the ampoule 102 to the manifold 120. A valve 126 is located on flow path 118. The valve 126 controls the flow of all fluids to the manifold 120; when the valve 126 is closed, no fluids may flow to the manifold 120. Conversely, when the valve 126 is opened, fluids may flow to the manifold. Additionally, a valve 124 is also located on flow path 118. The valve 124 controls the flow of carrier gas to the valve 126.

A valve 116 is located on flow path 136. The valve 116 controls the flow of precursor gas from the ampoule 102 to the valve 126.

Flow path 106 connects the substrate processing apparatus 100 with a source of carrier gas. The flow of the carrier gas through the flow path 106 into the rest of the flow paths of the substrate processing apparatus 100 is controlled by a valve 108. If the valve 108 is closed, there may be no fluid flow through the substrate processing apparatus 100.

Flow path 134 connects the flow path 106 with the ampoule 102. A valve 110 located on flow path 134 controls the flow of carrier gas from the flow path 106 into the ampoule 102. After the carrier gas flows into the ampoule 102, it may mix with evaporated precursor to form the precursor gas.

The flow of fluids through the substrate processing apparatus 100 may be controlled through the opening and closing of the various valves. Certain configurations of opened and closed valves will be discussed in greater detail in FIGS. 4A through 4D.

Figure 1B:
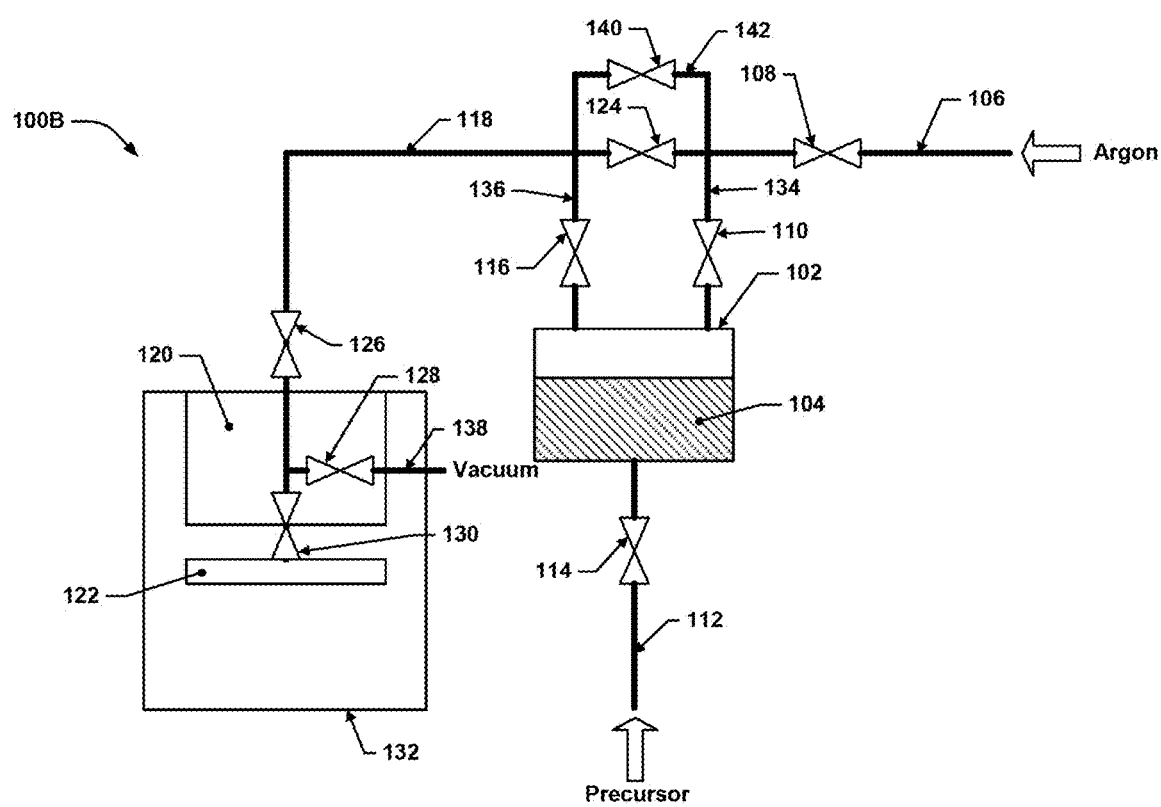
FIG. 1B shows a schematic representation of another example substrate processing apparatus with a fill on demand ampoule.

FIG. 1B shows a schematic representation of another example substrate processing apparatus with a fill on demand ampoule. The substrate processing apparatus 100B in FIG. 1B is similar to the substrate processing apparatus 100 in FIG. 1A. Substrate processing apparatus 100B includes an additional valve 140 connected by flow path 142. In the implementation of FIG. 100B shown in FIG. 1B, the flow path 142 and the valve 140 may offer an additional path for carrier gas to flow to the valve 126. In certain implementations, the flow path through the valve 124 may be used to flow carrier gas during operation of the substrate processing apparatus, while the flow path through the valve 140 may be used to flow carrier gas during maintenance of the substrate processing apparatus.

Figure 2:
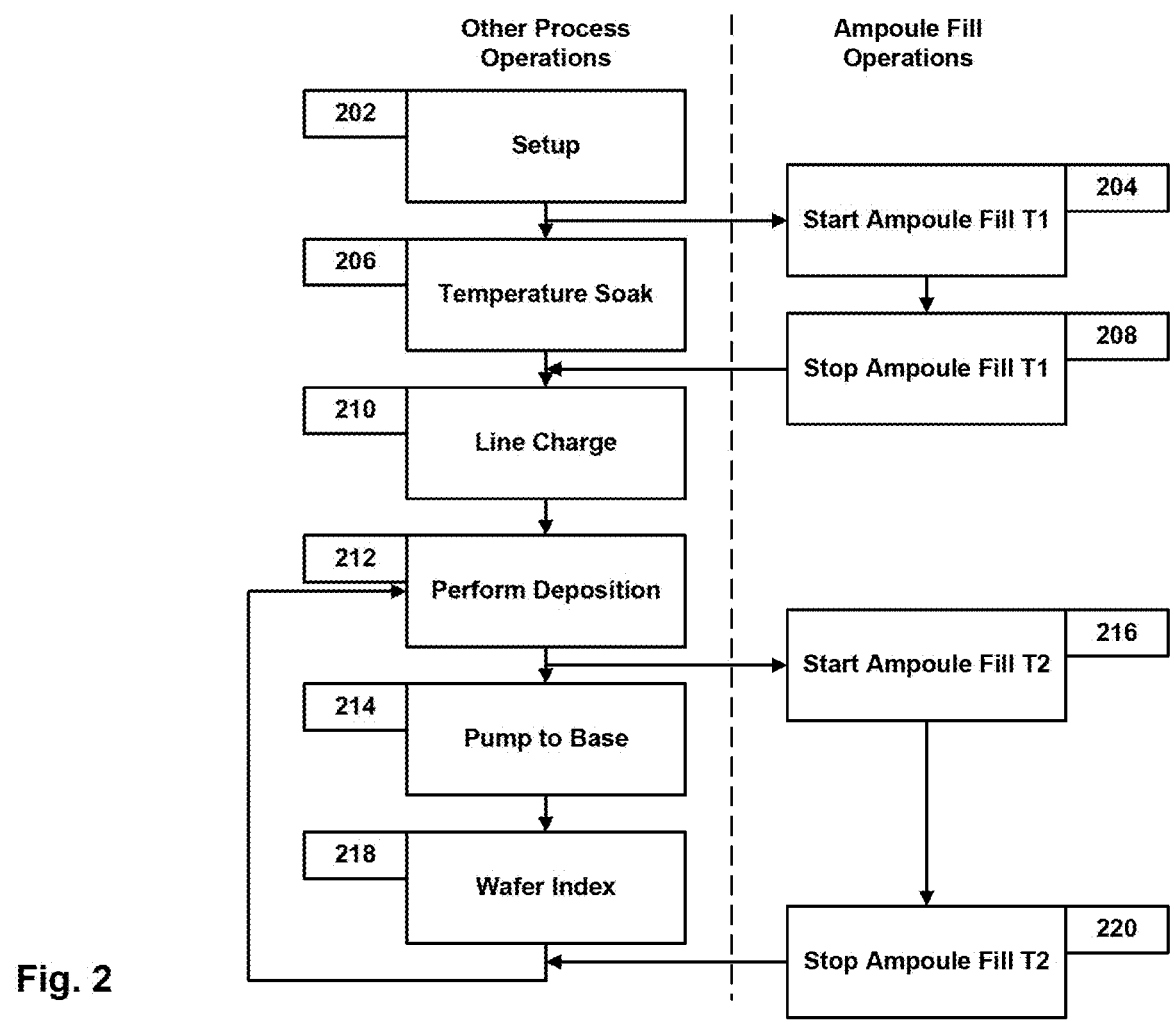
FIG. 2 is a process flow diagram detailing an example deposition process operation utilizing a fill on demand ampoule.

FIG. 2 is a process flow diagram detailing an example deposition process operation utilizing a fill on demand ampoule. FIG. 2 details ampoule fill operations and the timetable of the ampoule fill operations as compared to the rest of the process operations. In FIG. 2, ampoule fill operations are shown on the right side of the figure while other deposition process operations are shown on the left side. The process operation detailed in FIG. 2 may be an ALD processing operation, or may be other types of substrate processing operations that use a liquid reactant such as chemical vapor deposition, etching operations including atomic layer etching, and the like.

In operation 202, setup of the process operation is carried out. Operation 202 includes many different tasks that are involved in the setting up of processing operations such as general checking of the apparatus, the lifting of pins, the loading of substrates, and the programming of operations.

After operation 202, operation 204 starts the filling of the ampoule. Operation 204 begins the initial filling of the ampoule. At the beginning of operation 204, the ampoule may be completely empty.

While the ampoule is being filled, temperature soak occurs in operation 206. The temperature soak may heat the precursor to bring it to a desired temperature, such as between about 20 to 100 degrees Celsius for certain precursors used in ALD, and/or it may heat the substrate prior to deposition. The temperature that the precursor is heated to may be dependent on the chemical composition of the precursor. Certain implementations may heat the precursor and/or the substrate from room temperature up to a higher temperature (e.g., a temperature between about 25-45 degrees Celsius). Other implementations may heat the precursor and/or the substrate from room temperature up to a temperature of between about 25-60 degrees Celsius while yet other implementations may heat the precursor and/or the substrate from room temperature up to an even higher temperature (e.g., up to about 80 degrees Celsius). The heat soaking of the precursor as it is being filled may result in a precursor that is at the optimum temperature for the precursor to evaporate to the desired amount. Additionally, heat soaking the precursor during the filling of the ampoule may allow for greater substrate throughput since two setup operations are being performed concurrently. Finally, since no carrier gas is being flowed through the ampoule to carry evaporated precursor gas, filling the ampoule during heat soak also may minimize the effect resulting from agitation of the precursor during filling.

After the temperature soak of operation 206 is complete, but before the lines are charged in operation 210, the ampoule ceases being filled in operation 208. The ampoule may cease being filled due to a variety of different conditions. Such conditions are described in greater detail in FIG. 3. In certain implementations, the ampoule may initially be at a full level. In such implementations, the initial filling of the ampoule may be skipped.

In operation 210, line charge is performed. Line charge is the flow of gas through the flow paths of the substrate processing apparatus prior to delivering the precursor gas into the processing chamber. In other words, the lines leading to the chamber are charged to eliminate delay when the valves to the chamber are opened. For example, certain implementations may flow the carrier gas through various flow paths to carry precursor gas from the ampoule. The pre-flowing of such precursor gas may aid in having more consistent initial cycles of deposition by pre-charging the flow paths with precursor gas used in deposition such that when the valve to leading to the processing chamber is switched open, precursor gas is quicker to arrive in the processing chamber.

After the line charge in operation 210, deposition is performed in operation 212. Deposition performed in operation 212 may be a single cycle of deposition, or may be multiple cycles of deposition such as that performed during ALD.

After deposition is performed in operation 212, secondary ampoule filling is started in operation 216. The secondary ampoule filling in operation 216 may fill the ampoule back to a full level or may be designed to fill the ampoule until another stop fill condition is met. When a stop fill condition is met in operation 220, the second ampoule filing operation ceases. The secondary ampoule filling allows the ampoule to maintain a relatively consistent head volume, leading to greater wafer uniformity. During secondary ampoule filling, the ampoule may be heated to allow for more consistent precursor temperatures. In certain implementations such as the implementation described in FIG. 2, the secondary ampoule filling is timed to occur during a period when the agitation of the precursor resulting from the filling has a minimal effect on the substrate processing. In some implementations, such periods may be periods when no deposition is performed. In other implementations, deposition may be performed during such periods if the vapor pressure of the precursor is below a certain threshold. Precursors with low vapor pressures may be less sensitive to agitation from refilling and so may be more suitable to be refilled while deposition is performed. For example, precursors with a vapor pressure less than about 1 Torr are precursors that may be refilled during deposition. In certain implementations, the amount of precursor refilled during any single operation of secondary ampoule filling may be less than about 40% of the total ampoule volume, such as less than about 20%, less than about 10%, less than about 5%, or less than about 2% of the total ampoule volume.

While the secondary ampoule filling is performed, other process operations are still being performed, such as pump to base and wafer indexing. In operation 214, pump to base is performed. Pump to base is a process of evacuating a chamber to a base pressure provided by a vacuum pump. The process removes residual materials from the substrate processing chamber through, for example, vacuum ports in the processing chamber.

In operation 218, wafer indexing is performed. Wafer indexing is the transfer and orientation of substrates to an additional process station within the substrate processing chamber. Wafer indexing may be performed when the substrate processing chamber has multiple processing stations. In certain implementations, such as implementations involving a processing chamber with only one processing station, wafer indexing may not be performed.

After wafer indexing in operation 218, the process may proceed back to operation 212 and perform deposition again until all require deposition has been performed. Ampoule filling may be performed between each round of deposition.

Figure 3:
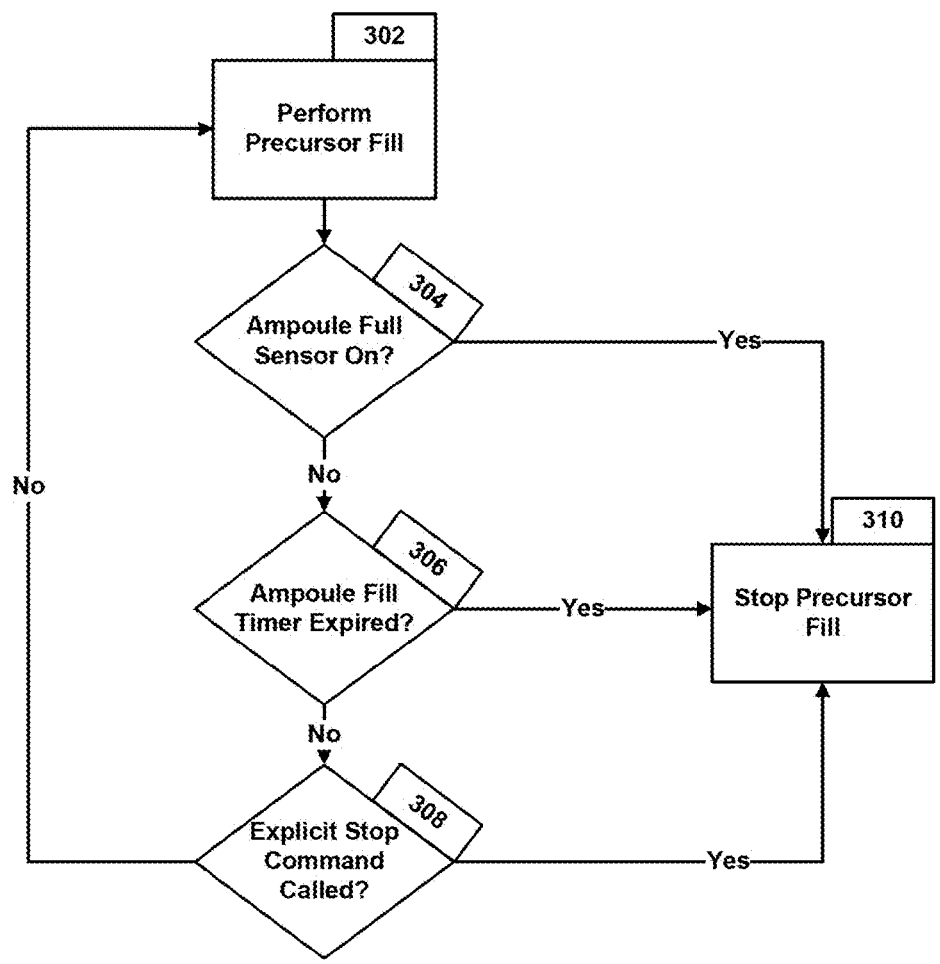
FIG. 3 is a process flow diagram detailing an algorithm to control an example fill on demand ampoule.

FIG. 3 is a process flow diagram detailing an algorithm to control an example fill on demand ampoule. In operation 302, a command is given to perform precursor fill. Operation 302 may correspond to operations 204 or 216 in FIG. 2. The command to perform the precursor fill may be given through logic contained in a controller. The controller may be a controller used to control other deposition operations of the substrate processing apparatus, or it may be a separate controller dedicated to controlling operations associated with the ampoule.

Once the command is given to perform the precursor fill, precursor begins to fill the ampoule. While the precursor fill is performed, the controller may also concurrently perform operations 304, 306, and 308.

In operation 304, the controller checks to see if the ampoule full sensor is on. The ampoule may contain a level sensor such as a discrete level sensor. The level sensor may be set to detect a certain precursor level within the ampoule such as the full level. Such a precursor full level may be calculated to result in an ampoule that contains an optimum head volume. In certain implementations, the full level may be a threshold volume calculated to arrive at the optimum head volume. Such threshold volumes may be, for example, a volume of precursor of around about 70-80% of the total volume of the ampoule such as about 75% of the total volume of the ampoule. In other implementations, the threshold volume may be a range of volumes. In such implementations, a precursor volume falling within the range may satisfy the full condition. In certain such implementations, subsequent secondary ampoule fillings may be adjusted based on the detected precursor volume. For example, the stop conditions of the subsequent secondary ampoule fillings may be adjusted.

In certain other implementations, the level sensor may report a low level. The low level may be reported when the volume of the precursor within the ampoule is below a threshold percentage of the ampoule volume. In such implementations, the threshold volume may be a volume of less than about 50% of the ampoule volume. In such implementations, the substrate processing apparatus may stop the processing of substrates when the level sensor reports a low level. In certain implementations, the substrate processing apparatus may finish all deposition cycles in a sequence of substrate deposition operations before stopping the substrate processing to refill the ampoule.

In operation 306, the controller checks to see if the ampoule fill timer has expired. The ampoule fill timer may be a timer set in the controller such that the ampoule fill process is performed for only a duration close to the duration that would be required to fill the ampoule to the full level. In certain implementations, the fill timer may be a duration slightly longer than the time required to fill the ampoule to the full level in order to introduce some safety factor. In other implementations, the ampoule fill timer may be much longer than the duration required to fill the ampoule to full. In such implementations, the fill timer duration may be selected to allow the best opportunity to fill the ampoule to a full level and the ampoule full sensor may be relied upon as the primary mechanism to prevent overfilling of the ampoule.

In certain implementations, the fill timer for the initial fill and the secondary fill may be different. In such implementations, the initial fill timer may be, for example, 45 seconds or less, while the secondary fill timer may be, for example, between 5 to 10 seconds. In other implementations, the fill timer may be adjusted based on a correction factor. The correction factor may be a factor to account for the differences in pressures of the refill lines of various different substrate processing apparatus. Thus, a substrate processing apparatus that has a high refill line pressure may have a low correction factor resulting in a shorter fill timer, while a substrate processing apparatus that has a low refill line pressure may have a high correction factor resulting in a longer fill timer. The refill line pressure may vary based on inherent properties of the substrate processing apparatus, or it may vary based on operators' experience with a particular piece of equipment. For example, the refill line pressure may be decreased if a further decrease in precursor agitation is desired. In addition, the correction factor may account for any variation upstream of a pressure indicator within the precursor refill line. Factors that may affect the line pressure include the diameter and length of the refill line.

In certain implementations, the secondary fill timer may stay constant regardless of the conditions detected during the initial fill. In other implementations, the secondary fill timer may be adjusted depending on conditions detected during the initial fill. For example, if, during initial fill, the ampoule full sensor was never detected to be on, the duration of the secondary fill timer may be lengthened to allow for a greater likelihood of the ampoule reaching a full level during the secondary fill operation.

In operation 308, the controller checks to see if an explicit stop command has been called. In certain implementations, an explicit stop command to cease filling the ampoule may be programmed into the controller before the performance of certain deposition steps, such as deposition steps where concurrent filling of the ampoule during performance of the steps may result in unacceptable agitation of the precursor. The explicit stop command may be a further safeguard against the failure of the ampoule full sensor and/or the ampoule fill timer. Additionally, the fill timer and/or the full volume may be user defined parameters in certain implementations. The explicit stop command may prevent errors in the user definition of the parameters from affecting the quality of substrate processing.

If the controller detects a "yes" result from any of operations 304, 306, or 308, the controller then proceeds to operation 310 and the precursor fill is stopped. If no "yes" result is detected from any of operations 304, 306, or 308, the controller may return to operation 302 and continue performing the precursor fill.

Figure 4A:
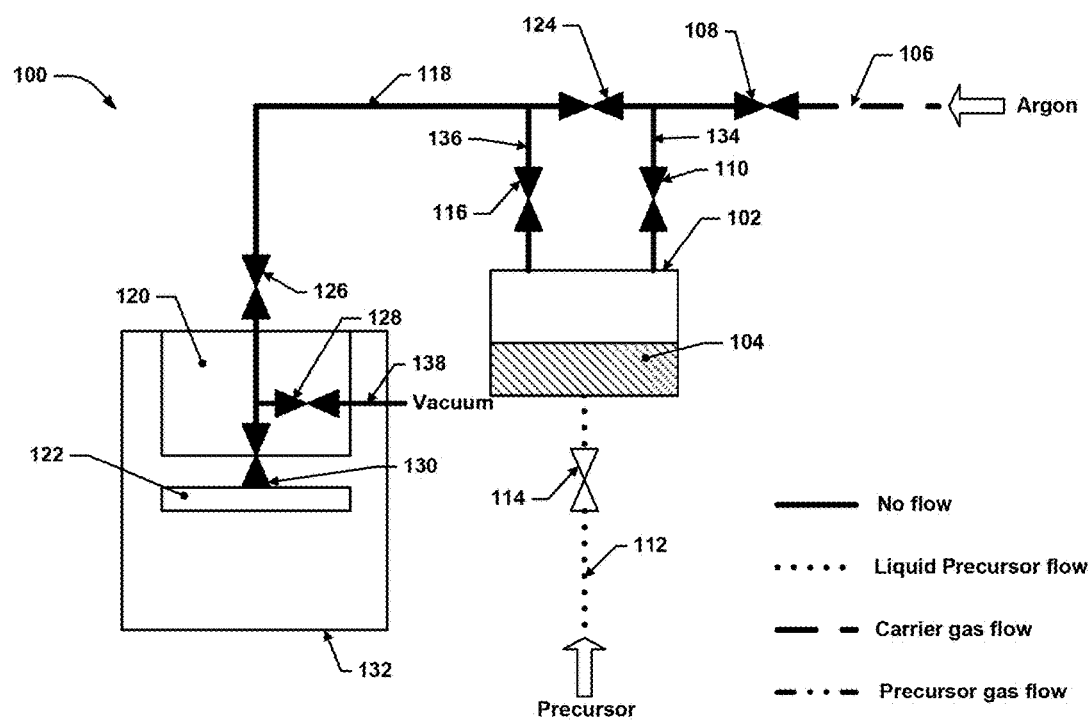
FIG. 4A shows a step in substrate processing for the example substrate processing apparatus of FIG. 1A.

FIG. 4A shows a step in substrate processing for the example substrate processing apparatus of FIG. 1A. The step shown in FIG. 4A corresponds to operation 204 of FIG. 2. The substrate processing apparatus 100 shown in FIG. 4A, as well as FIGS. 4B-C, may be a substrate processing apparatus with a similar configuration to that of the substrate processing apparatus shown in FIG. 1A. In FIGS. 4A-D, solid lines represent flow paths with no flow, dotted lines represent flow paths with liquid precursor flow, broken lines represent flow paths with carrier gas flow, and broken and dotted lines represent flow paths with precursor gas flow.

In FIG. 4A, initial filling of the ampoule 102 is being performed. In the implementation shown in FIG. 4A, all valves except for valve 114 are closed. Valve 114 is open to allow the flow of the precursor into the ampoule 102. In other implementations, valves 108, 124, 126, and 128 may be open. The ampoule 102 may be heated in FIG. 4A in order to bring the precursor to a desired temperature to facilitate evaporation of the precursor.

Figure 4B:
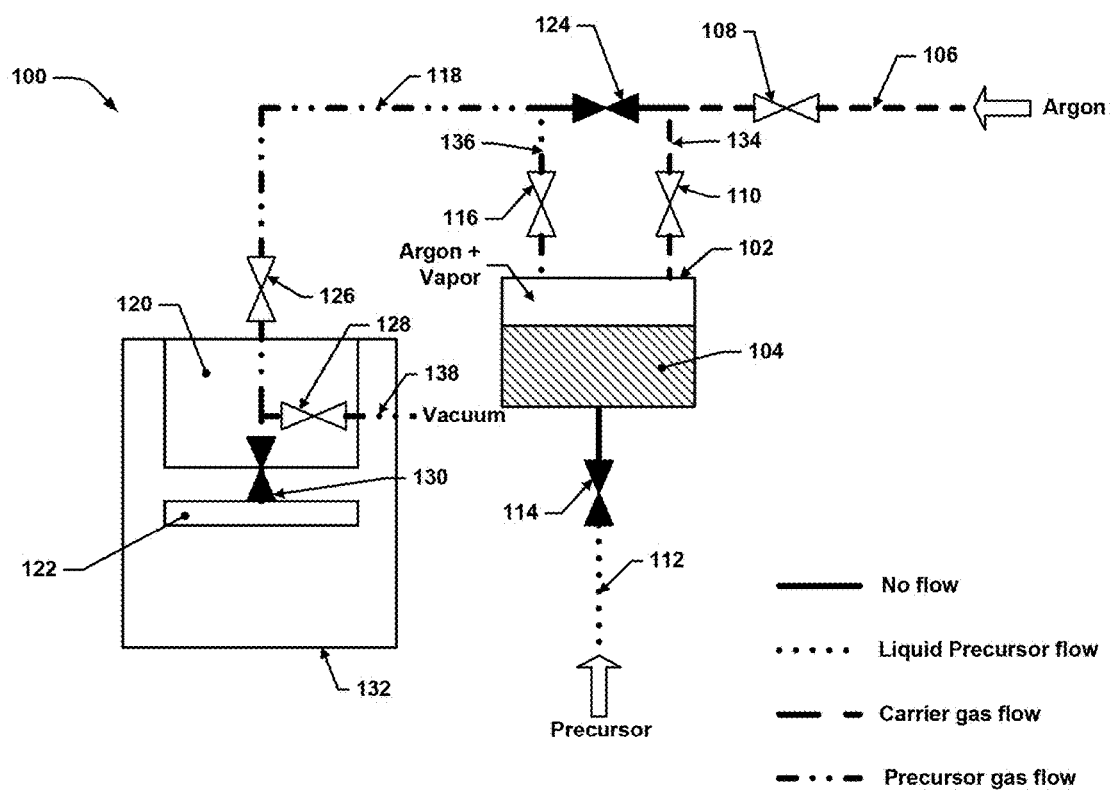
FIG. 4B shows another step in substrate processing for the example substrate processing apparatus of FIG. 1A.

FIG. 4B shows another step in substrate processing for the example substrate processing apparatus of FIG. 1A. The step shown in FIG. 4B corresponds to operation 210 of FIG. 2. In FIG. 4B, valve 114 is now closed as at least one of the conditions required to stop the filling of the precursor has been triggered.

In FIG. 4B, valves 108, 110, 116, and 126 are open to allow the substrate processing apparatus to pre-charge flow paths 118 and 136 with precursor gas flow. Since the showerhead 122 is not ready to receive the precursor gas flow in FIG. 2, the precursor gas that flows through flow paths 118 and 136 then flows through flow path 138 to a dump source. A continuous flow of precursor gas is supplied through flow paths 118 and 136 to ensure that there is a ready supply of precursor gas when the showerhead 122 is ready to receive the precursor gas.

In FIG. 4B, the precursor gas is a mixture of carrier gas and evaporated precursor. Carrier gas flows through flow path 106 and 134, which have open valves 108 and 110 respectively, to enter the ampoule 102. The ampoule contains evaporated precursor and the carrier gas mixes with the evaporated precursor to form the precursor gas. The precursor gas then flows out of the ampoule 102 via the flow path 136.

Figure 4C:
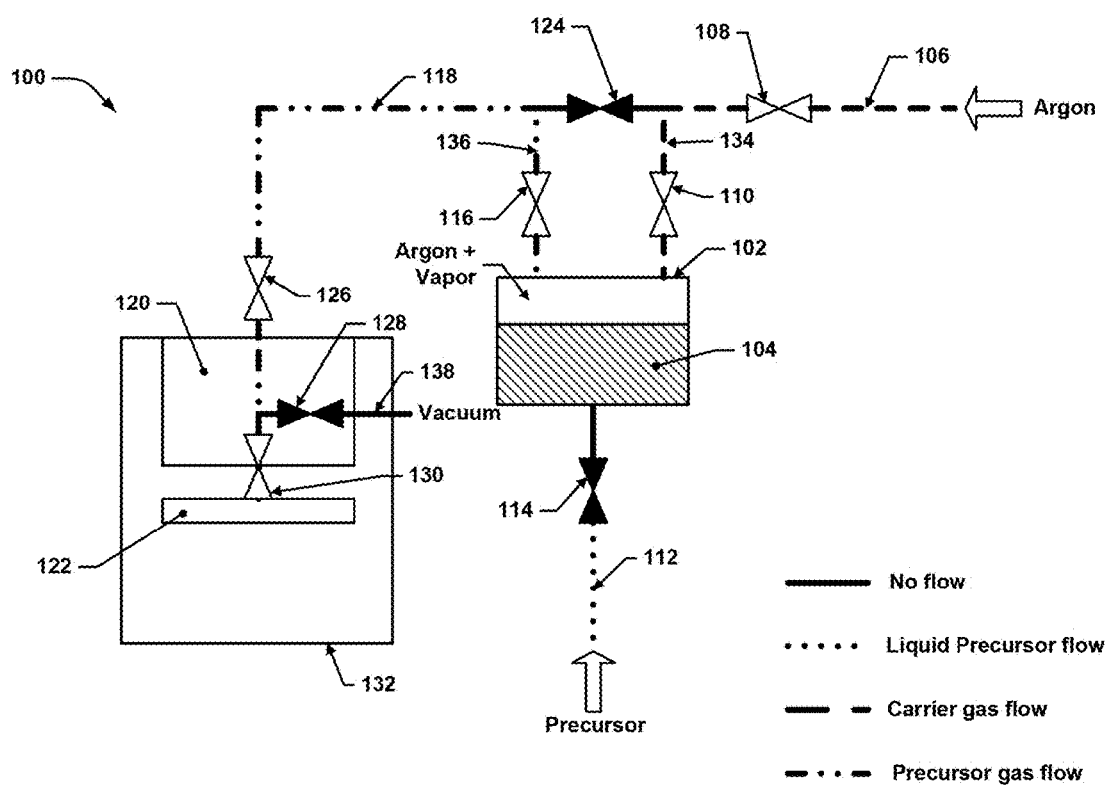
FIG. 4C shows an additional step in substrate processing for the example substrate processing apparatus of FIG. 1A.

FIG. 4C shows an additional step in substrate processing for the example substrate processing apparatus of FIG. 1A. The step shown in FIG. 4C corresponds to operation 212 of FIG. 2. In FIG. 4C, valve 128 is now closed, but valve 130 is now open to allow the precursor gas to flow through the showerhead 122 and into the processing chamber 132.

Figure 4D:
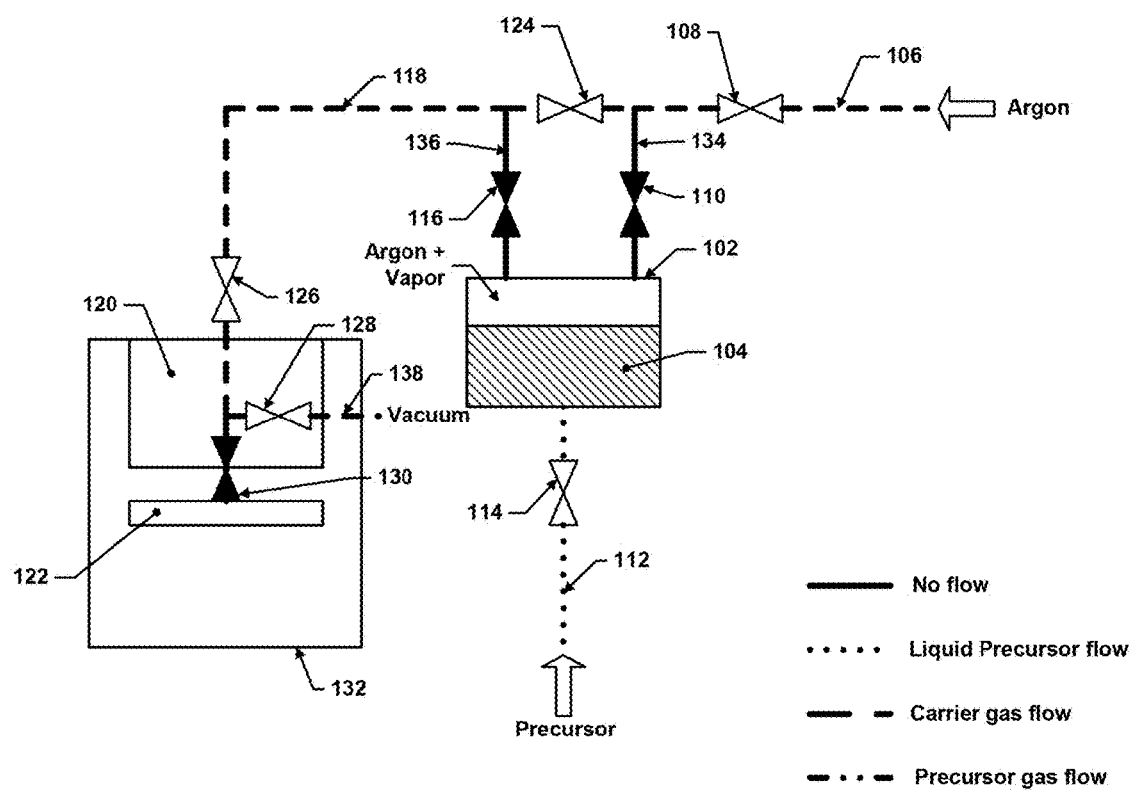
FIG. 4D shows a further step in substrate processing for the example substrate processing apparatus of FIG. 1A.

FIG. 4D shows a further step in substrate processing for the example substrate processing apparatus of FIG. 1A. The step shown in FIG. 4D corresponds to operation 214 of FIG. 2. In FIG. 4D, valves 110 and 116 are closed, but valve 124 is open. Thus, there is no flow of precursor gas through the flow paths, but carrier gas may flow through flow paths 106 and 118. Additionally, valve 130 is now closed to prevent the flow of carrier gas into the showerhead 122. Valve 128 is now open to allow the flow of carrier gas to the dump source.

In FIG. 4D, valve 114 is open to allow the refilling of ampoule 102 with precursor. The refilling shown in FIG. 4D is a secondary precursor refill.

Figure 5:
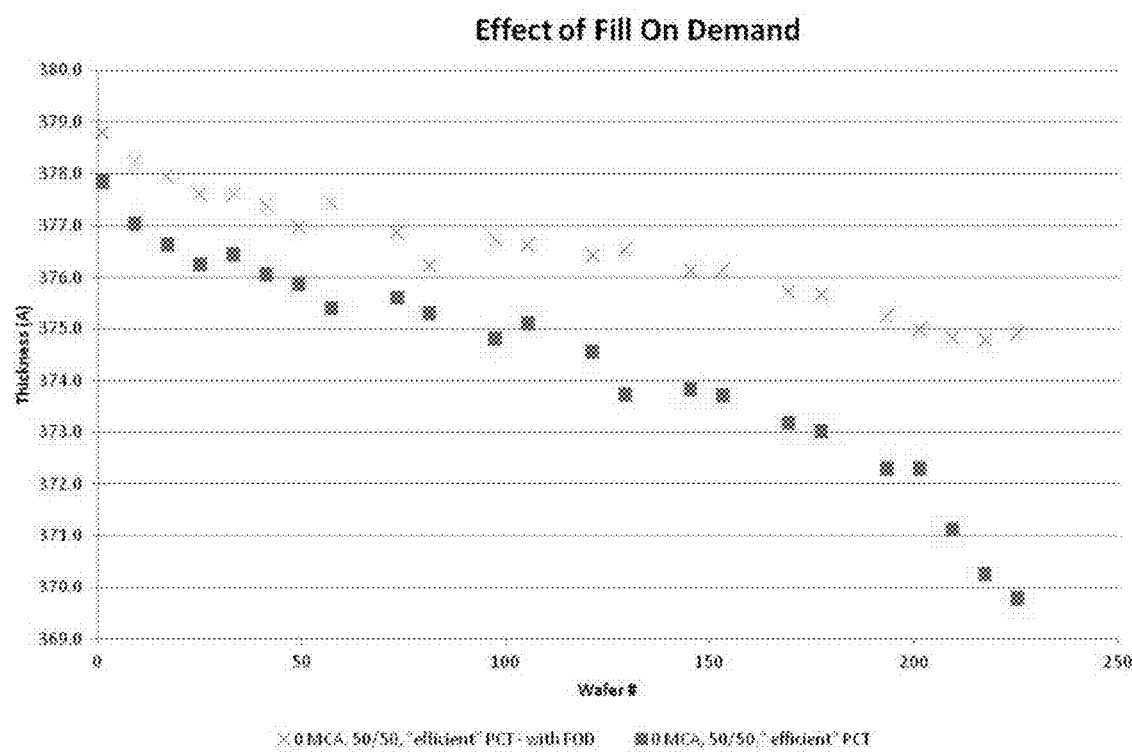
FIG. 5 is a comparison of substrate processing results for substrate processing with fill on demand versus substrate processing without fill on demand.

FIG. 5 is a comparison of substrate processing results for substrate processing with fill on demand versus substrate processing without fill on demand. In FIG. 5, the plots represented by "X" marks are deposition processes utilizing fill on demand, while the plots represented by square marks are deposition processes that do not utilize fill on demand.

As shown in FIG. 5, the deposition processes utilizing fill on demand have more consistent thicknesses while the deposition processes that do not utilize fill on demand have greater variances in their thicknesses. The deposition processes utilizing fill on demand show greater process uniformity than the deposition processes that do not utilize fill on demand.

Sensor Levels

Figure 6:
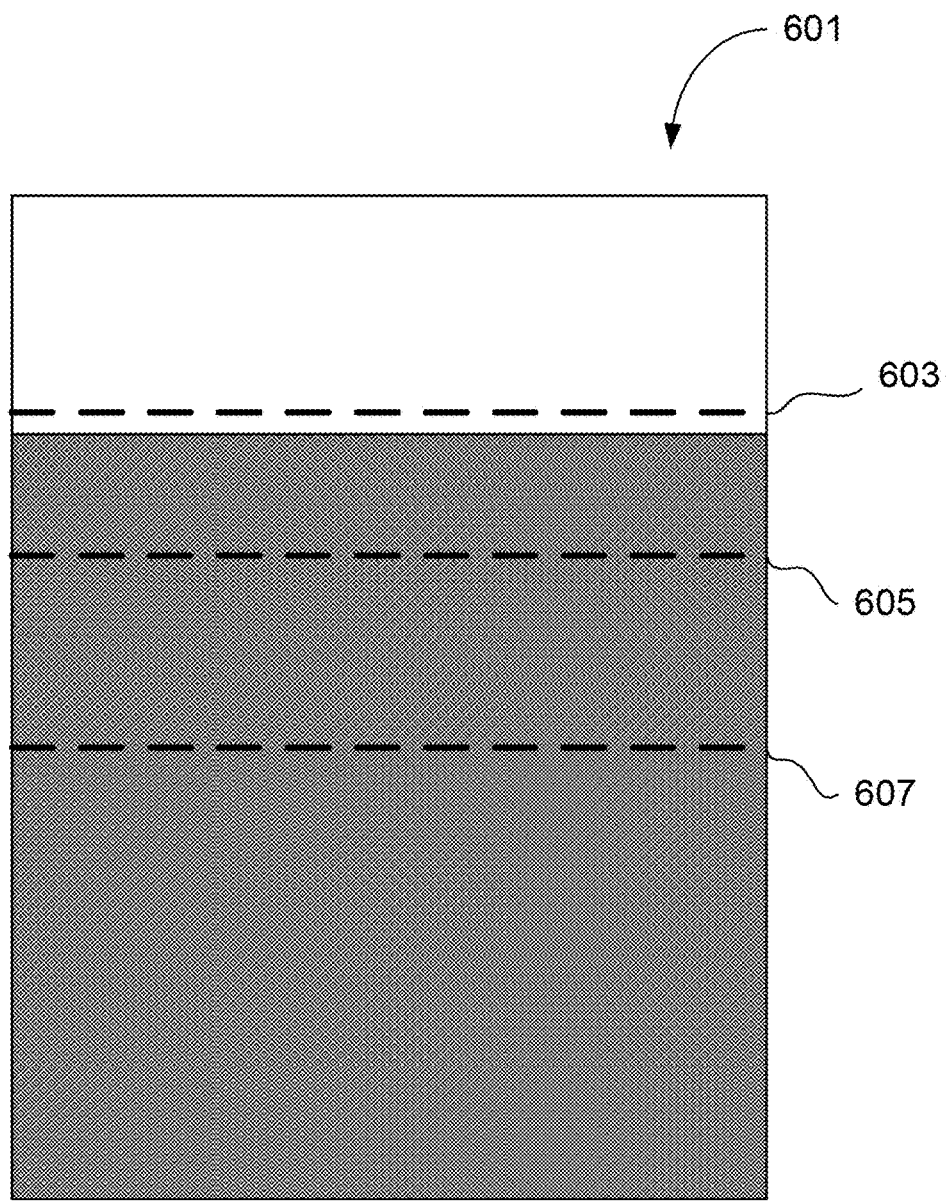
FIG. 6 illustrates an ampoule with a sensor and multiple sensor levels suitable for providing protection against overfill and under fill.

In certain embodiments, additional protections are deployed to address possible equipment issues such as an ampoule liquid level sensor malfunction. As mentioned above, the ampoule may have one or more sensors. In some embodiments, which sense one or more levels of liquid within the ampoule. In certain implementations, a single sensor senses two or more levels, and in still further embodiments, a single sensor senses three or more levels. FIG. 6 depicts an embodiment in which an ampoule 601 has one or more sensors configured to sense three sensor levels: a full sensor level 603, a low sensor level 605, and an empty sensor level 607.

In certain embodiments, the full sensor level is at an ampoule volume of between about 70% and 90% of the total fill volume of the ampoule. In certain embodiments, the low sensor level is at a level of between about 40% and 60% of the total fill volume of the ampoule. In certain embodiments, the empty sensor level is set at about 10% to 30% of the total fill volume of the ampoule. In one example, the full level sensor is marked at about 73% of the total ampoule volume, the low level sensor or is set at about 48% of the ampoule volume and the empty level sensor is set at about 12% of the total ampoule volume, which may be about 330 cubic inches. As further examples, the ampoule volume may be between about 100 and 1000 cubic inches, depending on the reaction chamber size and the process(es) supported.

Various types of physical sensors may be employed to determine the internal fill level. Examples include single point and multipoint liquid level sensors such as those available from Neal Systems, Inc. In some cases, a single physical sensor can measure two or more levels. In one example, a multipoint sensor is configured to measure three levels, the full level, the low level, and the empty level.

In some implementations, the ampoule control logic employs a primary check using the full sensor. When the full sensor changes state from off to on, indicating that the liquid level has reached the full level, the control logic instructs the fill system to cease further filling of the ampoule.

In some implementations, the ampoule control logic employs a primary check for preventing the ampoule from emptying. This check may determine that the full sensor has remained in an off state and fill is not occurred for a set number of cycles, e.g. about 230 cycles for certain ALD processes. In such cases, the control logic may instruct the system to (i) begin filling (assuming the deposition process can be gracefully stopped) or (ii) cease deposition until the ampoule sensor works properly. In some implementations, the number of cycles in this check is based on the expected level of consumption of liquid by the ALD process and the overall volume of the ampoule. For example, in some ampoules, protection is provided by automatically filling the ampoule every time a certain mass of liquid is calculated to have been consumed by the ALD process, for example about 3 to 7 g of liquid.

If a sensor fails, one or both of the above primary checks fails. One failure mode occurs when the full sensor, or the associated software, fails to accurately sense that ampoule liquid has reached the full level. Additional protections may be built into the ampoule control logic as described below.

In certain embodiments, the system is designed or programmed such that when an illogical sensor reading occurs, the system enters a soft shutdown or otherwise takes measures to avoid damage to the system and/or wafers being fabricated. One such illogical result occurs when a multiple level sensor detects that the full sensor is on while a lower level sensor is off. This result suggests that liquid has reached the full level but not the empty level. Obviously, such state cannot exist.

In another embodiment, when the lowest level sensor (e.g., an empty sensor) of a multiple level sensor is off, the system automatically takes other precautionary steps. In various embodiments, the lowest level sensor is designed to trigger a soft shutdown when it is off because liquid below the lowest level is deemed to put the ampoule in a state where damage can occur to a wafer and/or the system itself.

Soft Shutdown

In certain embodiments, when an error is generated using the protective measures described in this section or elsewhere throughout the patent application, the ALD tool or other deposition tool undergoes a "soft shutdown." In certain embodiments, a soft shutdown stops the ALD system from performing further deposition steps or other procedures typically undertaken during normal ALD processing. In some implementations, a soft shutdown will try to finish current wafer processing in the chamber, remove the wafers, and put module in OFFLINE mode. After that, no more wafers will be processed until the issue with the module is resolved. A soft shutdown may also stop further ampoule filling if filling is occurring.

In certain embodiments, the soft shutdown process generates a notification to the operator or to a control routine with in the fabrication facility. The notification may identify the particular issue that triggered the soft shutdown. Examples of such notifications may include the empty level sensor being in the off state, the full level sensor remaining on while cumulative refill times exceed a threshold, and the full sensor being in the on state for an extended period; e.g., a period that is greater than a threshold. Upon review receiving such notification, the control system and or the operator responsible for maintaining the ALD tool can take a corrective action intended to fix the notified problem and allow the ALD tool to resume normal operation. For example, the operator may fix a malfunctioning sensor, manually adjust and ampoule liquid level, and the like. After taking such corrective action, the tool may resume normal operations such as ampoule refill using a fill on demand procedure as described elsewhere herein.

Overfill Protection

In certain implementations, the ampoule fill procedure includes a routine or other logic for addressing problems caused by a full sensor showing that it is not on when the system is operating in a manner where it is expected that it should be on. As an example, a faulty or malfunctioning sensor might read off when in fact liquid has reached the level of the sensor, and therefore the sensor should read on. See sensor level 603 of FIG. 6. To address this potential issue, the ampoule fill logic maintains a cumulative time of refill from the end of the last time when the ampoule was filled. For example, a cumulative timer may reset whenever the full sensor comes on and the liquid to the ampoule stopped. If the cumulative time of refilling exceeds the threshold and the sensor has not yet reached the on state, the logic initiates a soft shutdown. In other words, anytime the ampoule needs to be filled, it is assumed that it will not take longer than {T} time. This time is the total time from multiple number of fill times (fill requests cumulatively). The ampoule fill logic keeps track of the total length of the fills and will enter an error state in the currently running routine if it exceeds {T}. For example, if $F_1=12$ s, $F_2=40$ s, and $F_3=12$ s, when T=60 s (for example), the logic will enter an error state four seconds before the end of $F_3$.

The threshold for the cumulative timer can be based on various parameters and typically includes the ampoule fill rate during the refill operations in question, the ampoule volume (particularly the maximum volume of liquid expected to provide safe operation), and the rate of consumption of liquid from the ampoule during the intervening ALD process steps while the timer is on. It should be understood that the ALD processes might be performed between times when ampoule refill operations are performed. In certain embodiments, the timer threshold is between about 30 and 300 seconds. In certain embodiments, the timer threshold is between about 50 and 90 seconds (e.g., about 60 seconds). In certain embodiments, the threshold fill time is determined based on laboratory test condition using the specific process chemical consumption rate and ampoule fill rate for the fabrication facility.

Figure 7:
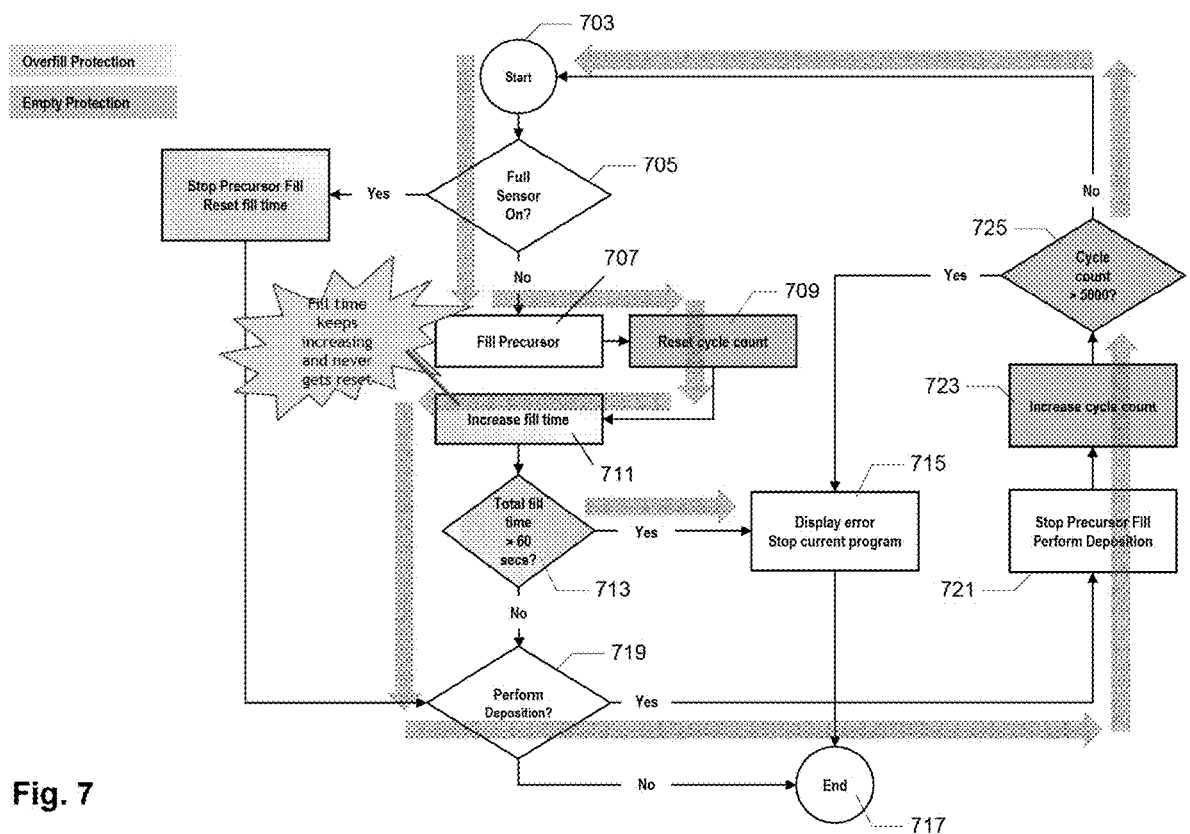
FIG. 7 presents a flow chart for an implementation of ampoule overfill protection.

FIG. 7 presents a flow chart for a specific implementation of overfill protection. The blocks shown in the flow chart represent execution steps in a program or other logic for implementing ampoule fill control in a deposition module. In the depicted embodiment, the ampoule control logic is represented as a loop that begins at the start operation 703. During execution, with each iteration, no particular operation occurs at block 703. In each iteration, the process logic determines, at a decision point 705, whether the full sensor is in the on state. If so, the overfill protection portion of the routine is not executed, and the process proceeds is as described with respect to FIG. 8. In the overfill protection portion of the routine, the full sensor is not on, and, as depicted in FIG. 7, the logic provides instructions to fill the ampoule with precursor as depicted in a block 707. Concurrently, the process resets a cycle count which may be used in the empty protection mode as described further with respect to FIG. 8. See block 709. As the fill proceeds, a fill timer keeps track of the accumulated fill time since last time the fill timer was reset. See block 711. Next, the ampoule fill logic determines whether the total accumulated fill time is greater than a threshold value such as 60 seconds. See decision block 713. If so, the logic puts the system into an error state and stops executing as depicted in block 715. The system may then enter a soft shutdown is as described above, and the process ends as depicted at block 717. If the accumulated time tallied by the fill timer has not exceeded the threshold, the control logic proceeds from block 713 to a subsequent decision block 719, where it determines whether the system is to perform deposition. If not, the routine gracefully ends at block 717. However, if the logic determines that deposition is to proceed, the process stops the precursor fill and concurrently pauses the timer as illustrated in a block 721. It should be understood that during the course of a deposition process, the cyclic deposition of material onto the substrate may pause for wafer indexing, pump to base, and other operations as described above. Each time this occurs, the ampoule may begin filling again and the fill timer restarts.

In the embodiment depicted in FIG. 7, the full sensor remains in an off state so that ampoule refill occurs whenever possible, consistent with the underlying fill on demand logic, and thereby remains in danger of overfilling the ampoule. Returning to block 721 in the process flow logic, the system begins performing deposition and then increments a cycle counter as illustrated in blocks 723 and 725, which will be described in further detail with reference to FIG. 8. The process control then returns to block 703 where the full sensor is again checked.

As explained, the logic depicted in FIG. 7 illustrates the operation of an overfill protection mode and assumes that the full sensor remains on at all times. In this state, the fill timer keeps increasing and never gets reset as illustrated at block 711. Therefore, even if the fill timer is paused repeatedly while filling stops during the above-described fill on demand algorithm, the accumulated fill time gets closer and closer to the threshold and will eventually trigger entry into an error state as illustrated at block 713 and 715.

While the protection described in this section is presented in the context of overfill protection when a full sensor is faulty or malfunctioning, the protection may extend to other situations where the full sensor does not turn on but is in fact is performing properly. For example, the full sensor may remain in an off state when liquid has not reached its level because there is a malfunction or other problem in providing liquid to the ampoule. Examples such problems include a refill valve to the ampoule not operating properly, slow or no delivery of liquid to the ampoule from the fabrication facility, and the like. In each of these cases, the fact that the full sensor remains off for an extended period of time while ampoule refill is presumably occurring, suggests that there is a problem, and as such, the ampoule control logic flags this problem as an error and may initiate a soft shutdown.

Protection Against Low Ampoule Liquid Levels

The ampoule control logic in certain embodiments may be designed to address potential problems caused by a liquid level sensor showing that it is on when in fact the liquid has not reached that level. In such cases, the sensor should properly read off. This malfunction of the sensor were could lead to failure to refill the ampoule when the liquid level becomes dangerously low. The primary protection against under fill relies on a sensor reading off when the liquid level falls below the sensor's read level. In certain implementations, the control logic provides a secondary protection by keeping track of precursor cycles from the last time an ampoule fill is executed. If the number of such cycles is greater than a threshold number, the system may execute a soft shutdown.

In certain embodiments, the ampoule empty protection logic may include the following features:

During steady state operation, it is assumed that the ampoule will fill at least once every {N} deposition cycle.

The control logic keeps track of the number of cycles since the last fill.

The process module will be sent into Soft Shutdown if the count exceeds {N}.

If a fill is actually executed, the count is reset to zero (0).

{N} is estimated at 5000 cycles (this value is process specific and can be adjusted based on actual tool)

Figure 8:
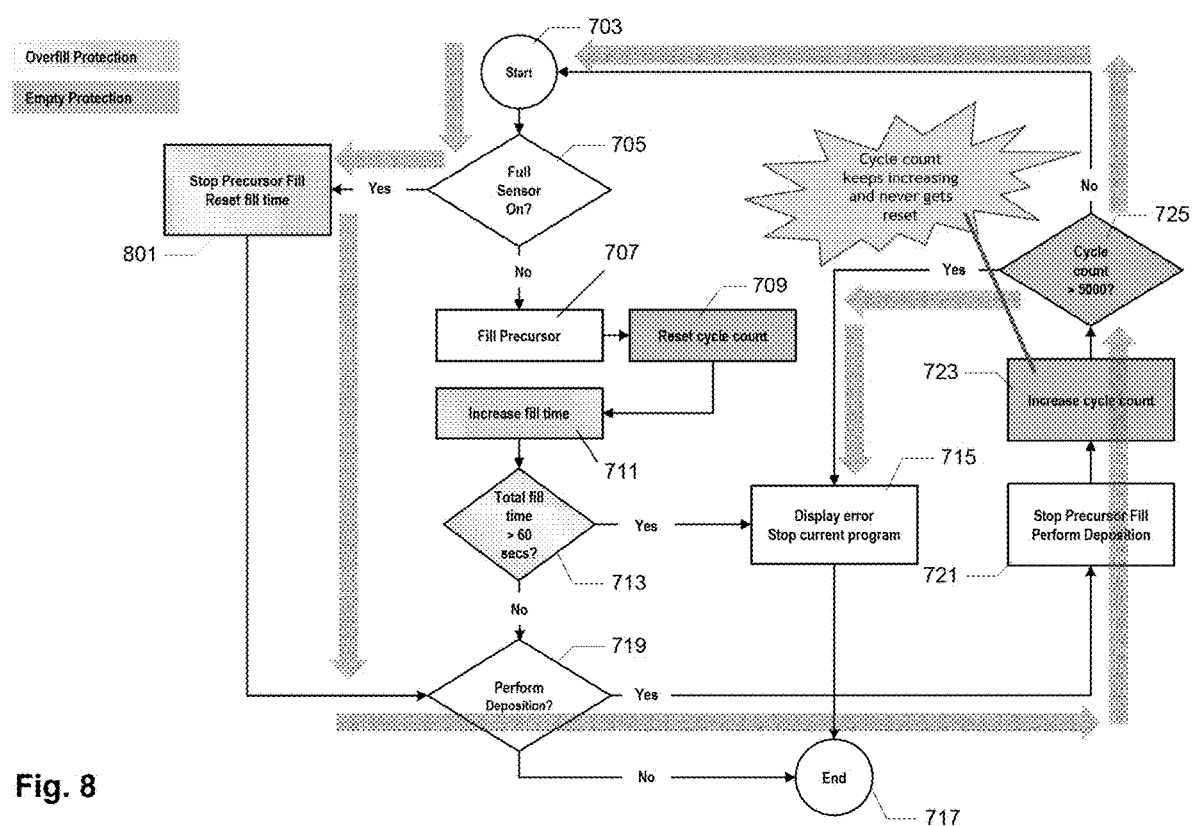
FIG. 8 presents a flow chart for an implementation of ampoule low liquid level protection.

FIG. 8 presents the flow chart of FIG. 7 but depicts an empty protection mode built on top of the fill on demand ampoule logic. As before, the iterative process determines whether the full sensor is on as illustrated at a decision block 705. In this example, it is assumed that the full sensor is malfunctioning by reading that it is on when in fact it should be off. As illustrated, when the logic determines a block 705 the full sensor is on, the ampoule fill logic will stop any current precursor fill. See block 801. Concurrently, the logic resets the fill timer which is relevant to the overfill protection routine described with respect to FIG. 7. After stopping precursor fill at block 801, the process next determines whether it's time to perform deposition as illustrated at decision block 719, which was described above. Assuming that deposition is to be performed, the process logic instructs the system to perform deposition as illustrated at block 721. As deposition proceeds, each cycle is counted, or at least those cycles in which precursor is consumed. See block 723. As cycle count increments over one or more sequential deposition cycles which may pause periodically for wafer indexing and the like, a cycle counter compares the current cycle count against some threshold number of cycles as illustrated at decision block 725. As explained, the cycle count is determined to protect the ampoule from becoming dangerously under filled. When the cycle count ultimately exceeds the threshold—presumably because the full sensor is faulty or malfunctioning—the process control is directed to block 715 where it puts the system in an error state and ends the routine's execution, typically accompanied by a soft shutdown. Until the time when the cycle count exceeds the threshold, the process repeatedly loops back to block 703 and 705 where the full sensor is again checked. Assuming, as is the case here, that the full sensor remains on, the process proceeds through the branch including block 801 where deposition continues to occur with no renewed ampoule filling.

The chosen cycle threshold may be based on the number of cycles determined to consume an amount of precursor from the ampoule that would deplete the liquid level within the ampoule to a point where it negatively impacts the process (e.g., the deposited film properties will be negatively impacted). The threshold may be determined based upon the size of the ampoule, and hence its responsiveness to changes in level during refill, and the consumption of liquid precursor per ALD cycle. In certain embodiments, the cycle threshold is between about 3000 and 8000 cycles. In certain embodiments, the cycle threshold is between about 4000 and 6000 cycles (e.g., about 5000 cycles). The number of cycles may correspond to a particular number of wafers processed; e.g., between about 50 and 100 wafers.

In certain ALD processes, not every cycle consumes liquid precursor from the ampoule. For example, one or more ALD cycles during certain deposition processes intentionally do not draw precursor from the ampoule. Such "no dose" cycles may be used to check for the proper functioning of the process and generation of particles or other problems that may deserve attention. During such cycles, the liquid level within the ampoule is not reduced. Therefore, in some implementations, the ampoule control logic recognizes the cycle as one that does not consume liquid precursor from the ampoule, and therefore does not included in its count toward the number of cycles compared against the threshold for an error state.

Controller Configurations

In some implementations, a controller is part of a system, which may be part of the examples described herein. The controller may include "logic" such as ampoule fill logic or other control logic discussed herein. Such systems may comprise semiconductor processing equipment, including a processing tool or tools, chamber or chambers, a platform or platforms for processing, and/or specific processing components (a wafer pedestal, a gas flow system, an ampoule etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, refilling of ampoules, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for filling an ampoule of a substrate processing apparatus, the method comprising:
   (a) determining that an ampoule fill start condition for filling the ampoule with a liquid precursor is met;
   (b) filling the ampoule with precursor, wherein filling the ampoule with the precursor is performed concurrent with at least one other substrate processing operation;
   (c) determining that a sensor level in the ampoule indicates that the ampoule is not full, wherein a primary fill stop condition is met when the sensor level in the ampoule indicates that the ampoule is full;
   (d) maintaining a cumulative time of filling the ampoule, wherein the cumulative time of filling the ampoule is all of the time that precursor is flowing to the ampoule since the cumulative time of filling the ampoule was last reset, wherein the cumulative time of filling the ampoule is reset when the sensor level in the ampoule indicates that the ampoule is full;
   (e) determining that a secondary fill stop condition is met, wherein the secondary fill stop condition comprises determining that the cumulative time of filling exceeds a threshold; and
   (f) in response to determining that the secondary fill stop condition is met and in response to determining that the sensor level in the ampoule indicates that the ampoule is not full, ceasing the filling of the ampoule with the precursor.

2. The method of claim 1, wherein the cumulative time of filling is temporarily stopped one or more times when ampoule refill temporarily ceases and deposition commences, but the cumulative time of filling resumes when filling starts again.

3. The method of claim 1, wherein the threshold is between about 50 seconds and 90 seconds.

4. The method of claim 1, further comprising initiating a soft shutdown when ceasing the filling in operation (e).

5. The method of claim 1, wherein the sensor generating the sensor level in the ampoule is malfunctioning.

6. The method of claim 1, wherein a system providing the liquid precursor to the ampoule is malfunctioning.

7. The method of claim 1, wherein the ampoule fill start condition comprises determining that the substrate processing apparatus is in or is about to enter a phase after one or more substrates have been loaded into a substrate processing chamber of the substrate processing apparatus, before any of the one or more substrates have been unloaded from the substrate processing chamber, and while deposition is not occurring in the substrate processing chamber.

8. The method of claim 1, wherein the ampoule fill start condition comprises determining that a sequence of deposition operations has been completed on substrates contained in the substrate processing apparatus.

9. The method of claim 8, wherein the sequence of deposition operations are deposition operations associated with Atomic Layer Deposition.

10. The method of claim 1, wherein the ampoule fill start condition includes determining that the precursor volume is below a threshold volume.

11. The method of claim 1, wherein the ampoule fill start condition includes determining that setup for deposition operations is currently being performed.

12. The method of claim 1, wherein the at least one other substrate processing operation that is performed concurrent with filling the ampoule includes a wafer indexing operation.

13. The method of claim 1, wherein the at least one other substrate processing operation that is performed concurrent with filling the ampoule includes a temperature soak of the precursor and/or the substrate.

14. The method of claim 1, wherein the at least one other substrate processing operation that is performed concurrent with filling the ampoule includes a pump to base operation.

* * * * *